United States Patent [19]
Weinmann, Jr.

[11] Patent Number: 5,435,533
[45] Date of Patent: Jul. 25, 1995

[54] ADJUSTABLE CLAMPING FIXTURE FOR VIBRATING VARIOUS SIZED CIRCUIT BOARDS

[75] Inventor: Robert H. Weinmann, Jr., Laguna Hills, Calif.

[73] Assignee: Screening Systems, Inc., Laguna Hills, Calif.

[21] Appl. No.: 119,720

[22] Filed: Sep. 10, 1993

[51] Int. Cl.6 .................................................. B25B 1/14
[52] U.S. Cl. ...................................... 269/228; 269/279
[58] Field of Search ............... 269/228, 279, 282, 283, 269/91, 93, 94, 99, 100, 104, 111, 113

[56] References Cited

U.S. PATENT DOCUMENTS

| | | |
|---|---|---|
| 3,164,984 | 1/1965 | Gertel . |
| 3,208,270 | 9/1965 | Hill . |
| 3,286,744 | 11/1966 | Stall et al. .................. 269/91 |
| 3,924,844 | 12/1975 | Bachtel, Jr. . |
| 3,945,246 | 3/1976 | Wadensten . |
| 4,133,519 | 1/1979 | Shin et al. ................. 269/279 |
| 4,181,025 | 1/1980 | Abstein, Jr. et al. . |
| 4,181,029 | 1/1980 | Talbott, Jr. . |
| 4,270,390 | 6/1981 | Kimball et al. . |
| 4,335,873 | 6/1982 | Kiefer ........................ 269/228 |
| 4,630,811 | 12/1986 | Rudisill . |
| 4,735,089 | 4/1988 | Baker et al. . |
| 4,783,999 | 11/1988 | Kimball . |
| 4,912,980 | 4/1990 | Baughn . |
| 4,996,881 | 3/1991 | Tauscher et al. . |
| 5,014,000 | 5/1991 | Schlagheck . |
| 5,083,463 | 1/1992 | Marshall et al. . |
| 5,156,051 | 10/1992 | Marshall . |

*Primary Examiner*—Robert C. Watson
*Attorney, Agent, or Firm*—Blakely, Sokoloff, Taylor & Zafman

[57] ABSTRACT

A mounting fixture for a vibration table which can compensate for work pieces that have different dimensions. The fixture includes a support block which has an elongated slot that allows the fixture to be adapted for work pieces of different lengths and widths, and a pair of clamping blocks which have corresponding chuck and groove features that can compensate for different work piece thicknesses.

7 Claims, 2 Drawing Sheets

ADJUSTABLE CLAMPING FIXTURE FOR VIBRATING VARIOUS SIZED CIRCUIT BOARDS

BACKGROUND OF THE INVENTION

1. Field of the Invention

The present invention relates to a clamping fixture that clamps a printed circuit board to a vibration table.

2. Description of Related Art

Electronic card assemblies typically contain a number of integrated circuit packages soldered to a printed circuit board. The solder joints of the IC packages must be capable of withstanding shock and vibration loads. To test the structural integrity of an electronic card assembly, the electronic card is typically mounted to a shock/vibration table. The vibration table is constructed to exert shock and vibrational forces onto the card. Relative movement between the electronic card and the table may distort the resultant energy curve of the card. To prevent movement between the card assembly and the table, the edges of the card are therefore secured by some type of mounting fixture.

U.S. Pat. No. 5,014,000 issued to Schlagheck discloses a vibration table assembly which has a mounting fixture that can secure a plurality of printed circuit boards to a vibration table. The fixture has a center metal block which contains a plurality of grooves located on opposite sides of the block. Spaced from each side of the center block are a pair of outer blocks that also have a plurality of grooves. The ends of the printed circuit boards are inserted into corresponding grooves and held in position by the blocks. The blocks are mounted to the vibration table by a number of bolts that screw into corresponding holes in the table. The table has a number of holes that allow the outer blocks to be moved relative to the center block, to compensate for circuit boards that have different lengths.

The grooves of the Schlagheck fixture are fixed and can only accept circuit boards that all have the same corresponding thickness. Therefore to test thicker boards a new mounting fixture must be assembled to the table. Dismounting the fixture and assembling a new fixture increases the test time and ultimately the overall cost of the test. Additionally, the mounting fixture of the Schlagheck table has a relatively large mass and a corresponding low resonant frequency. If the frequency range of the vibration load extends into the resonant frequency of the mounting fixture, the fixture will distort the energy curve of the table. It would therefore be desirable to provide a mounting fixture for a vibration table that has a high resonant frequency and can easily compensate for circuit boards that have varying dimensions.

SUMMARY OF THE INVENTION

The present invention is a mounting fixture which couples a work piece such as printed circuit board to a vibration table. The vibration table may have a plurality of fixtures that clasp the ends of the circuit board. The board ends are located between the groove of a base block and a chuck member of a top block. The top block is connected to a toggle clamp which exerts a force on the block and secures the circuit board within a groove of the base block. The toggle clamp and base block are connected to a toggle support block which is attached to a body support. The toggle support block can pivot relative to the body support and the table, to allow the fixture to grasp the circuit board from different angles. The body support has an oblong slot which provides clearance for a bolt that secures the fixture to the vibration table. The oblong slot allows the fixture to be relocated to a different location on the table, to compensate for variations in the width and length of the work piece.

The base block has a pair of opposite grooves that each have a different depth. Likewise, the top block has a pair of chuck members that each have a different length. The blocks can be rotated so that there can be created 4 different combinations of adjacent chuck members and grooves. The different chuck/groove combinations compensate for different work piece thicknesses. The fixture has a relatively small mass and a high resonant frequency that is typically outside the range of the energy curve of the table.

It is therefore an object of the present invention to provide a mounting fixture for a vibration table which can secure various work pieces that have different dimensions.

It is also an object of the present invention to provide a mounting fixture for a vibration table which has a relatively high resonant frequency.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
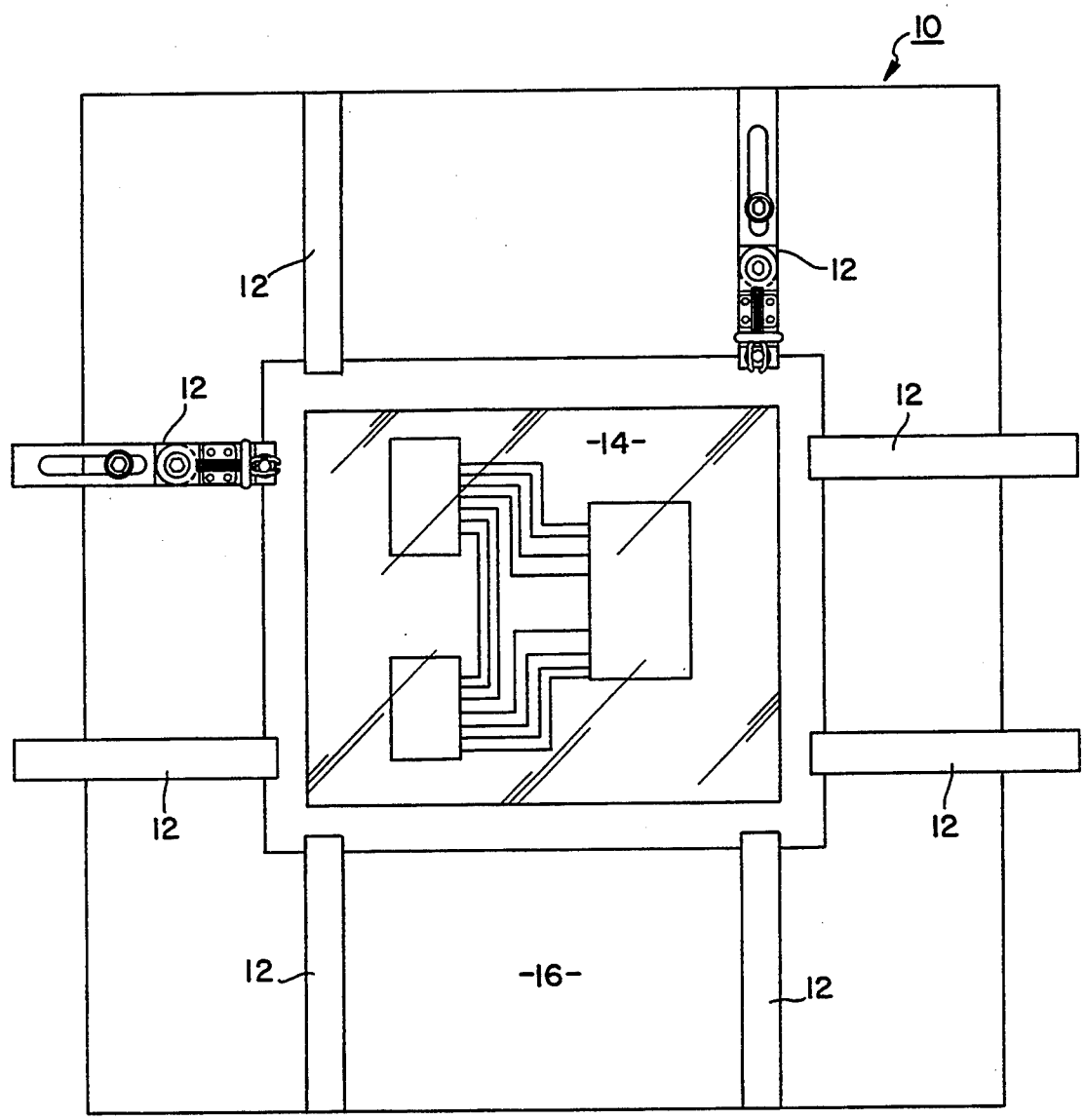
FIG. 1 is a vibration table with mounting fixtures of the present invention.

Referring to the drawing more particularly by reference numbers, FIG. 1 shows a vibration table assembly 10 which has a plurality of mounting fixtures 12 that secure a work piece 14 to a vibration table 16. The work piece 14 is typically a printed circuit board assembly. Although a circuit board assembly is described and shown, it is to be understood that the work piece 14 can be any object. The vibration table 16 is constructed to displace the work piece 14 to induce vibration and shock loads on the board 14. The vibration table 16 is typically constructed to create simultaneous vibration/shock loads in a plurality of directions.

Figure 3:
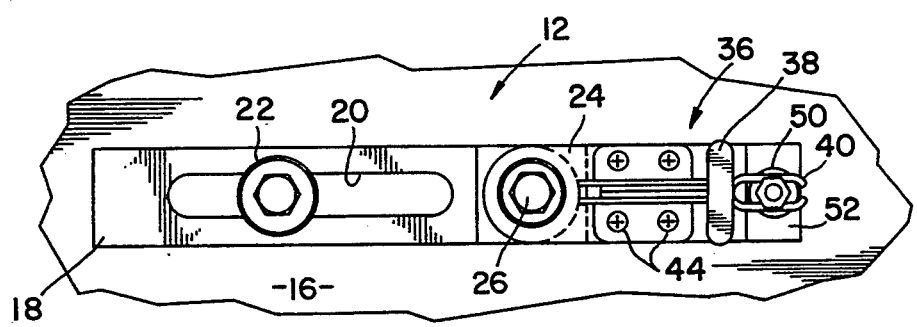
FIG. 3 is a top view of the mounting fixture.
Figure 2:
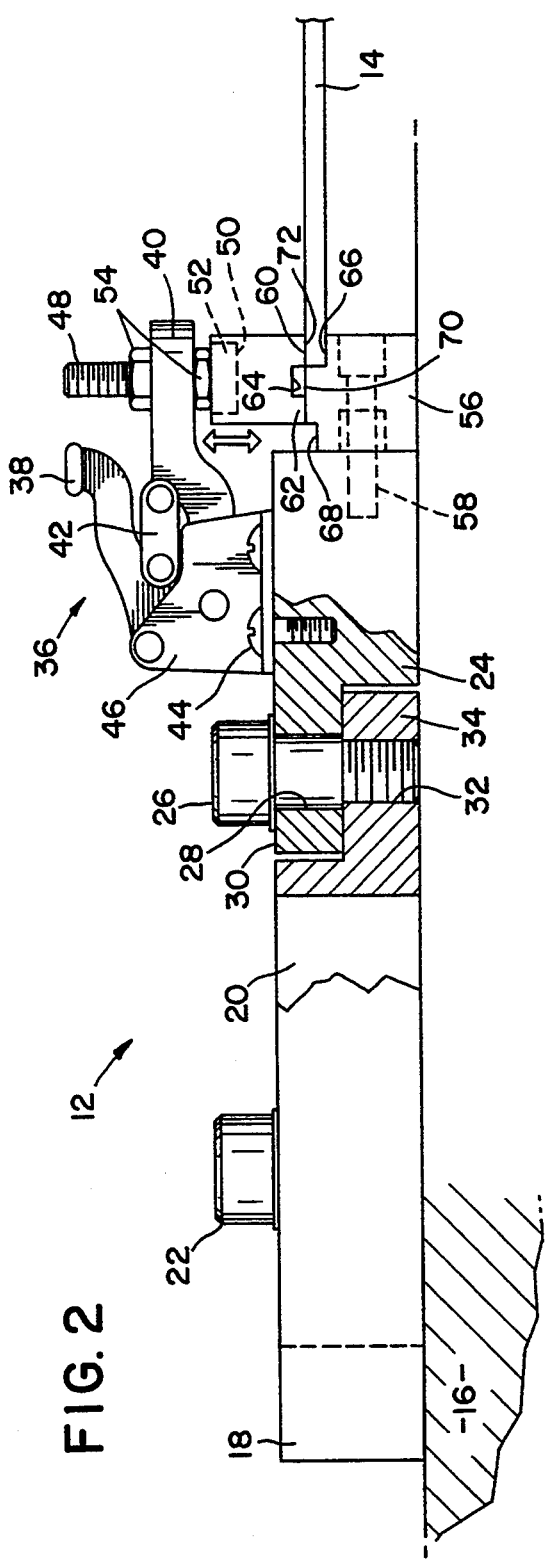
FIG. 2 is a side view of the mounting fixture.

FIGS. 2 and 3 show the mounting fixture 12 of the table assembly 10. The fixture 12 has a body support 18 which has an elongated slot 20. The slot 20 provides clearance for a bolt 22 that screws into a corresponding hole (not shown) in the table 16. The elongated slot 20 allows the fixture 12 to be moved relative to the table 16, so that the fixture can compensate for work pieces 14 that have different widths and lengths.

The body support 18 is connected to a toggle block 24 by bolt 26. The bolt 26 extends through a clearance hole 28 in a flange portion 30 of the block 24 and is screwed into a threaded hole 32 located in a corresponding flange 34 of the support body 18.

The toggle block 24 supports a toggle clamp 36 which has a handle 38 that is coupled to a lever 40 by an over-center linkage 42. The toggle clamp 36 is mounted to the block 24 by four screws 44. The handle 38 is pivotally mounted to a toggle clamp body block 46 and is adapted to move between a first position and a second position. The lever 40 has a pin 48 which extends into the bore 50 of a top clamping block 52. The pin 48 is secured to the lever 40 by a pair of nuts 54. The top block 52 moves in the direction indicated by the arrows in response to the rotation of the handle 38 between the first and second positions. The over-center linkage 42 maintains the handle 38 and block 52 in one of the two positions.

The top clamping block 52 is adjacent to a base clamping block 56 which is connected to the toggle support block 24 by a pair of screws 58. The top block 52 has a first chuck member 60 and a second chuck member 62 that extend from a bottom side 64 at opposite ends of the block 52. Likewise, the base clamping block 56 has a first groove 66 and a second groove 68 located at opposite ends of a top side 70 of the block 56. The first chuck member 60 is located adjacent to the first groove 66 to define a clamp opening 72. The end of the work piece 14 is inserted into the opening 72, so that the chuck 60 will engage and secure the part 14 to the table 12. The first chuck member 60 is shorter than the second chuck member 62. Likewise, the first groove 66 is deeper than the second groove 68.

Figure 4D:
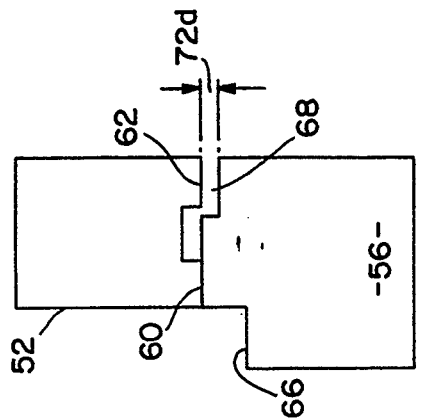
FIG. 4d is a side view of the clamping blocks of the mounting fixture in a fourth position.
Figure 4C:
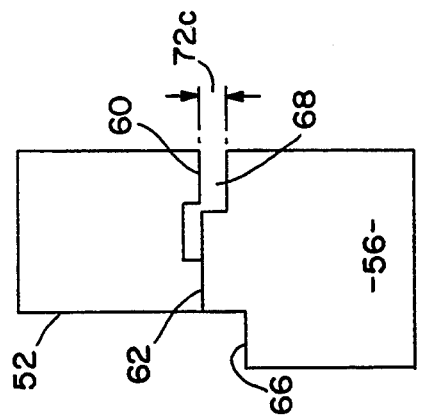
FIG. 4c is a side view of the clamping blocks of the mounting fixture in a third position.
Figure 4B:
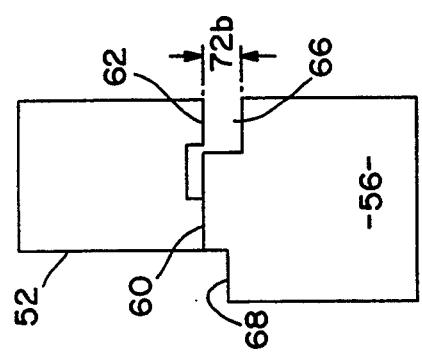
FIG. 4b is a side view of the clamping blocks of the mounting fixture in a second position.
Figure 4A:
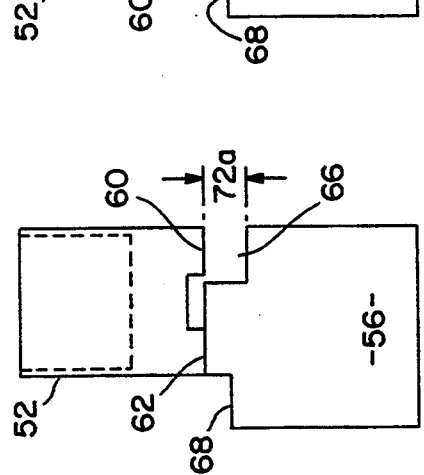
FIG. 4a is a side view of the clamping blocks of the mounting fixture in a first position.

The blocks 52 and 56 can be rotated to create a variety of different openings 72 for the end of the work piece 14. FIGS. 4a–d show the four different chuck and groove combinations. FIG. 4a shows the first chuck member 60 aligned with the first groove 66 to create a first opening 72a. FIG. 4b shows the top block 52 rotated so that the second chuck member 62 is adjacent to the first groove 66 to create an opening 72b. FIG. 4c shows the base block 56 rotated so that the first chuck member 60 is adjacent to the second groove 68 to create opening 72c. Finally, FIG. 4d shows both the base block 56 and the top block 52 rotated so that the second chuck member 62 is adjacent to the second groove 68 to create opening 72d. In the preferred embodiment, the openings 72a–d are 0.160, 0.128, 0.096 and 0.064 inches wide, respectively.

In operation, the handle 38 of the toggle clamp 36 is pulled to the first position so that the end of the work piece 14 can be inserted into the opening 72. The handle 40 is then rotated to the second position, so that the top block 52 moves downward and the first chuck member 60 engages and secures the end of the part 14. The work piece 14 is then tested by the vibration table assembly.

The work piece is removed to insert a new part that may have a length, width and thickness that is different than the first piece. To compensate for the change in length and width of the part, the bolts 22 are unscrewed and the body supports 18 are moved so that the openings 72 can receive the ends of the work piece. The base block 56 can then be detached from the toggle block 26 and rotated to compensate for the thickness of the part. Likewise, the top block 52 can be removed from the pin 48 and rotated to align the second chuck member 62 with either the first 66 or second 68 grooves. To change the angle at which the blocks 26 and 56 grasp the part 14, the toggle support block 24 can be pivoted about bolt 26.

The blocks are typically constructed from a 4140 steel. The fixture 12 has a mass with a relatively high resonant frequency. The resonant frequency of the fixture is typically well outside the frequency range of the energy curve of the table. The present invention thus provides a low mass mounting fixture that can compensate for various dimensional variations in the working piece.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A clamping fixture that can clamp a work piece to a table, comprising:
   a base clamping block which has a first groove and a second groove located on a top side of said base clamping block, said first groove having a first depth greater than a second depth of said second groove;
   a top clamping block which has a first clamping member and a second clamping member extending from a bottom side of said top clamping block, said second clamping member being longer than said first clamping member, said top clamping block being located relative to said base clamping block such that one of said clamping members is adjacent to one of said grooves to create an opening which can receive the work piece; and,
   a clamping device that clamps said clamping member onto the work piece.

2. The fixture as recited in claim 1, further comprising a support body that couples said clamping device and said base clamping block to the table.

3. The fixture as recited in claim 2, wherein said support body has an elongated slot that allows said support body to be moved relative to the table.

4. The fixture as recited in claim 1, wherein said clamping device is a toggle clamp, said toggle clamp having a handle coupled to said top clamping block by a pin and an over-center linkage mechanism, said handle being capable of moving between a first position and a second position, wherein said pin presses said top clamping block onto the work piece when said handle is in said second position.

5. The fixture as recited in claim 4, wherein said toggle clamp is supported by a toggle support block that is pivotally connected to a support body.

6. The fixture as recited in claim 4, wherein said toggle clamp has a lever that is connected to said overcenter linkage mechanism and which is coupled to said pin by a pair of nuts.

7. A clamping fixture that can clamp a work piece to a table, comprising:
   a base clamping block which has a first groove and a second groove located on a top side of said base clamping block, said first groove having a first depth greater than a second depth of said second groove;
   a top clamping block which has a first clamping member and a second clamping member extending from a bottom side of said top clamping block, said top clamping block further includes a bore and is constructed so that said second clamping member is longer than said first clamping member, said top clamping block being located relative to said base clamping block such that one of said clamping members is adjacent to one of said grooves to create an opening which can receive the work piece;

a toggle clamp that has a pin that is received by said bore in said top clamping block, said toggle clamp having a handle coupled to said pin by an over-center linkage mechanism and which can be moved between a first position and a second position, wherein said pin presses said chuck onto the work piece when said handle is in said second position;

a toggle support block that supports said toggle clamp and is pivotally connected to said base clamping block; and, a support body connected to said toggle support block, said support body having an elongated slot which provides clearance for a bolt that couples said support body to the table.

* * * * *